United States Patent [19]
Zhou et al.

[11] Patent Number: 5,783,961
[45] Date of Patent: Jul. 21, 1998

[54] INVERTED AMPLIFYING CIRCUIT

[75] Inventors: Changming Zhou; Guoliang Shou; Makoto Yamamoto; Sunao Takatori, all of Tokyo, Japan

[73] Assignees: Sharp Kabushiki Kaisha, Osaka; Yozan, Inc., Tokyo, both of Japan

[21] Appl. No.: 764,637

[22] Filed: Dec. 11, 1996

[30] Foreign Application Priority Data

Dec. 12, 1995 [JP] Japan .................. 7-346523

[51] Int. Cl.$^6$ ............ H03K 5/153; H03H 11/26
[52] U.S. Cl. ............ 327/85; 327/277; 327/283; 327/344
[58] Field of Search ............ 327/85, 77, 80, 327/81, 434, 437, 581, 271, 272, 277, 283, 284, 285, 552, 558, 559, 335, 344, 361, 354, 337

[56] References Cited

U.S. PATENT DOCUMENTS

| | | | |
|---|---|---|---|
| 4,695,748 | 9/1987 | Kumamoto | 327/85 |
| 4,851,721 | 7/1989 | Okitaka | 327/437 |
| 5,231,319 | 7/1993 | Crafts et al. | 327/277 |
| 5,453,709 | 9/1995 | Tanimoto et al. | 327/277 |
| 5,457,417 | 10/1995 | Shou et al. | 327/356 |
| 5,459,423 | 10/1995 | Nozawa et al. | 327/277 |
| 5,465,064 | 11/1995 | Shou et al. | 327/361 |
| 5,469,102 | 11/1995 | Shou et al. | 327/361 |

FOREIGN PATENT DOCUMENTS 7-94957 4/1995 Japan .................. H03F 1/34

*Primary Examiner*—Toan Tran
*Attorney, Agent, or Firm*—Cushman Darby & Cushman IP Group of Pillsbury Madison & Sutro LLP

[57] ABSTRACT

The present invention has an object to provide an inverted amplifying circuit with improved accuracy of output and reduced electric power consumption. In an inverted amplifying circuit according to the present invention, a MOS switch is connected between pMOS and nMOS of a CMOS inverter and between balancing resistances. The MOS switch is opened when the inverted amplifying circuit does not work.

4 Claims, 3 Drawing Sheets

5,783,961

1
INVERTED AMPLIFYING CIRCUIT

FIELD OF THE INVENTION

The present invention relates to an inverted amplifying circuit for surely obtaining the relationship of linearity between input and output voltages.

BACKGROUND OF THE INVENTION

With respect to such an inverted amplifying circuit, the inventors proposes an inverted amplifying circuit with odd number of stages of MOS inverters serially connected in Japanese Patent Laid-Open Publication 7-94957. An input voltage is connected to the MOS inverter at the first stage through an input capacitance. An output of the MOS inverter of the last stage is input to the MOS inverter at the first stage through a feedback capacitance. An output of the MOS inverter at the last stage is grounded through a grounded capacitance, and an output of the MOS inverter at intermediate stage is connected to the supply voltage and the ground through balancing resistances. The inverted amplifying circuit has a good linearity and superior function for reducing electric power consumption. Now, there exists eager demand for further reduction of electric power consumption.

The inventors proposes a matched filter using an inverted amplifying circuit similar to the above, in which a supply voltage is connected to a MOS inverter through a MOS switch, in Japanese patent application 7-212517 (filed on Jul. 28, 1995). Electric power is appropriately stopped by the structure. However, an output accuracy is deteriorated due to large voltage drop.

SUMMARY OF THE INVENTION

The present invention solves the conventional problem and has an object to provide an inverted amplifying circuit with improved accuracy of output and reduced electric power consumption.

In an inverted amplifying circuit according to the present invention, a MOS switch is connected between pMOS and nMOS of a CMOS inverter and between balancing resistances. The MOS switch is opened when the inverted amplifying circuit does not work.

Hereinafter, embodiments of an inverted amplifying circuit is described with reference to the attached drawings.

2

Figure 10:
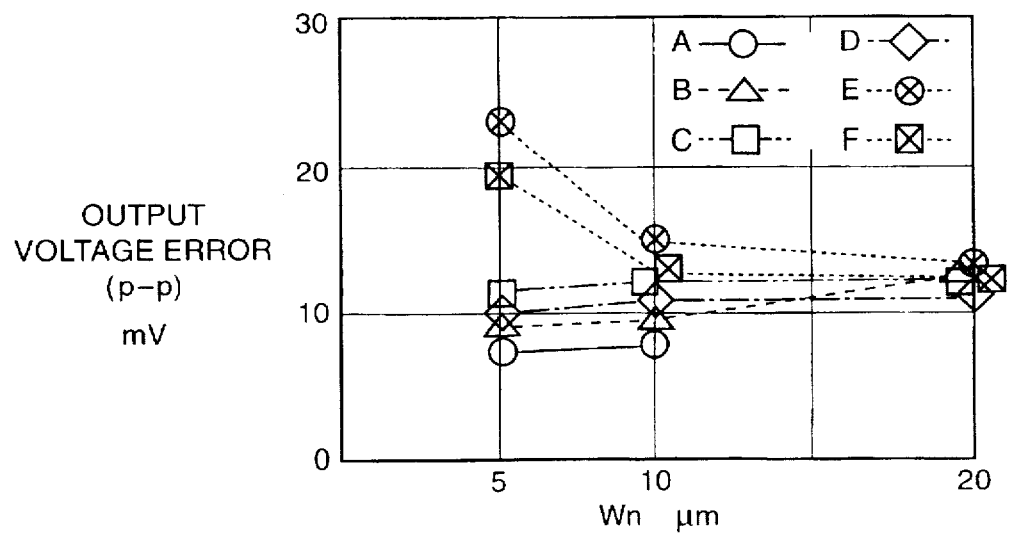

FIG. 10 is a graph showing the difference (p—p) of the embodiments and the comparative examples.

PREFERRED EMBODIMENT OF THE PRESENT INVENTION

Figure 1:
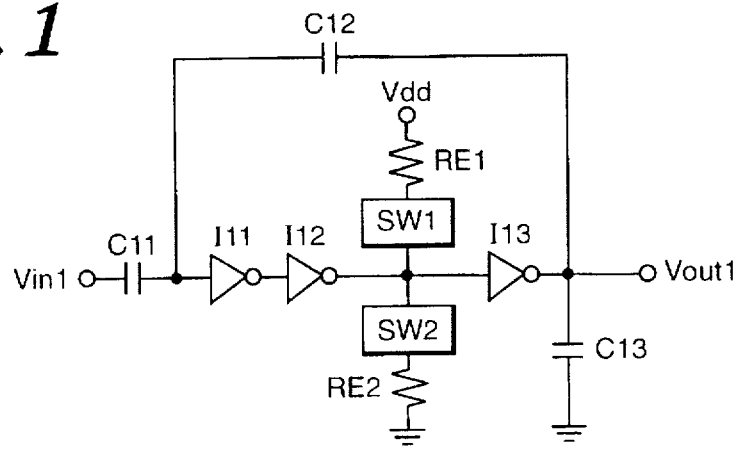
FIG. 1 shows a circuit of the first embodiment of an inverted amplifying circuit according to the present invention.

In FIG. 1, in an inverted amplifying circuit, MOS inverters I11, I12 and I13 are serially connected. An input voltage Vin1 is connected to I11 through a capacitance C11, and simultaneously, an output of an inverter I13 at the last stage is input to I11 through a feedback capacitance C12. A feedback system with high open gain multiplied the gains of I11 to I13 is structured by it, and high linearity is surely obtained, whose output voltage for Vin1 is Vout1. As an input voltage is connected to I11 through the capacitance C11, an inverted amplifying driven by voltage is performed and electric current consumption is restrained.

An output of I13 is grounded through a grounded capacitance C13. An output of I12 is connected to a supply voltage Vdd and the ground through balancing resistances RE1 an RE2, respectively. Unstable oscillation is prevented in the feedback system of high gain by this structure. In the inverted amplifying circuit of Japanese open-laid publication 7-94957, unstable oscillation is similarly prevented MOS switches SW1 and SW2 are connected between balancing resistances RE1 and RE2. MOS switches described later are connected to I11, I12 and I13. These MOS switches are open when the inverted amplifying circuit does not work and electric current consumption Is restrained in the CMOS and in the balancing resistances.

Figure 2:
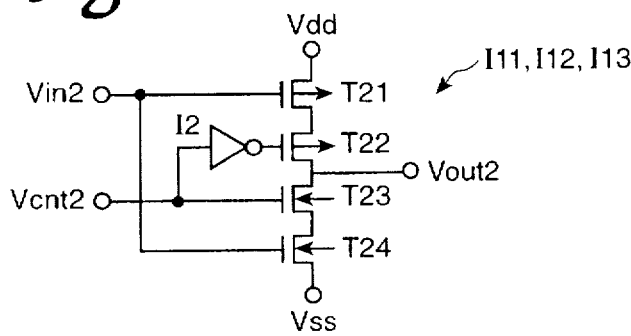
FIG. 2 shows a circuit of a CMOS inverter in the embodiment.

As shown in FIG. 2, the CMOS inverters I11, I12 and I13 include a pair of main pMOSs (shown by T21) and a pair of main nMOSs (shown by T24). An input voltage Vin2 (output voltage of I12 in FIG. 1) is impressed to the gate of those transistors. The supply voltage Vdd is connected to a source of T21, and a low voltage (the ground, for example) is connected to a source of T24. A MOS switch is connected between drains of T21 and T24. The MOS switch connects a drain of sub-pMOS (shown by T22) to a drain of sub-nMOS (shown by T23). Control signals are connected to gates of T22 and T23 by the MOS switch. A control signal Vcnt2 is connected to the gate of T23, simultaneously connected to the gate of T22 after it is inverted by an inverter I2. When Vcnt2 is high level, T22 and T23 are conductive at the same time, and are cut-off when Vcnt2 is low level at the same time T21 and T24 are connected with or insulated from each other by the MOS switch.

Figure 3:
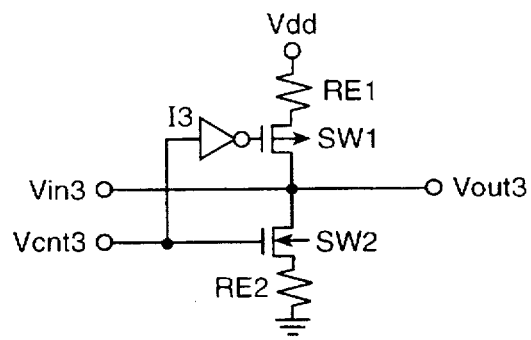
FIG. 3 shows a Circuit of a balancing resistance in the embodiment.

As detailedly shown in FIG. 3, the SW1 and SW2 in the balancing resistances include pMOS switch and nMOS switch, respectively. In the pMOS switch SW1, the drain thereof is connected to the drain of nMOS switch SW2, and a Control signal Vcnt3 is connected to the gates of SW1 and SW2. The control signal Vcnt3 is connected to the gate of SW1 after it is inverted by an inverter I3 as well as connected to the gate of SW2. That is, SW1 and SW2 are conductive at the Same time when Vcnt3 is high level, and insulated at the same time when Vcnt3 is low level. RE1 and Re2 are connected or cut off by it. When the inverted amplifying circuit is used, SW1 end SW2 are conductive and an inverted output Vout3 corresponding to Vin3 is output from the drains of SW1 and SW2. When the inverted amplifying circuit is not used, SW1 and SW2 are insulated so that no electric current occurs on RE1 and RE2. Electric current consumption can be reduced by it.

Tho capacity of the grounded capacitance disclosed in Japanese open-laid publication 7-94957 is assumed to be C0[pF], that of the grounded capacitance in this embodiment is settled as approximately 2C0. The balancing resistances are equivalently settled to each other. Good results can be obtained by the first embodiment, and also by another embodiment settling a grounded capacitance to be approximately 3C0. The function of the present embodiment is described later along with the second and the third embodiments.

Figure 4:
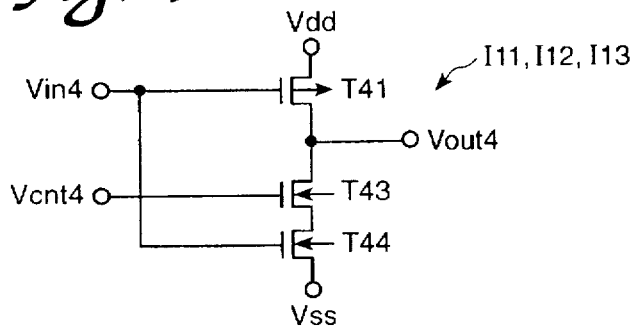
FIG. 4 shows a circuit of a CMOS inverter in the second embodiment.
Figure 5:
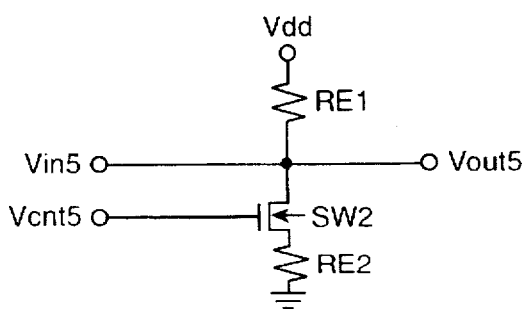
FIG. 5 shows a circuit of a balancing resistance of the embodiment.

FIG. 4 shows a CMOS of the second embodiment, and FIG. 5 shows balancing resistances in the embodiment. In the second embodiment, sub-pMOS in the first embodiment (T22) is omitted and only sub-nMOS (shown by T43) is provided, and MOS switch SW1 of the balancing resistances is omitted and only SW2 is provided. In the second embodiment, the grounded capacitance is approximately 3CO. In FIG. 4, corresponding portions of those in FIG. 2 have reference numbers including "4" substituted for "2" of the reference numbers in FIG. 2.

Figure 6:
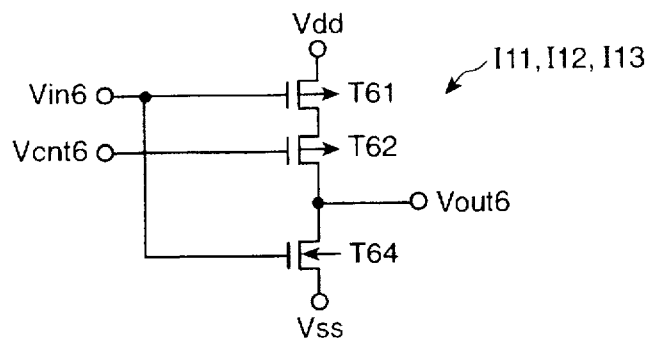
FIG. 6 shows a circuit of a CMOS inverter in the third embodiment.
Figure 7:
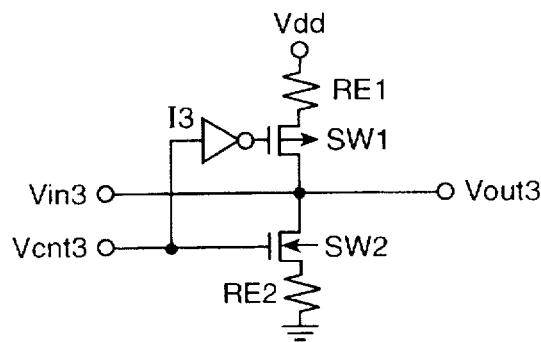
FIG. 7 shows a circuit of a balancing resistance in the embodiment.

FIG. 6 shows a CMOS of the third embodiment, and FIG. 7 shows a balancing resistances of the embodiment. In the third embodiment, sub-nMOS in the first embodiment (T23) is omitted and only sub-pMOS (shown by T62) is provided, and MOS switch SW1 of the balancing resistance is omitted and only SW2 is provided. In the third embodiment, the grounded capacitance is approximately 3CO. In FIG. 6, corresponding portions of those in FIG. 2 have reference numbers including "6" which is substituted for "2" of the reference numbers in FIG. 2.

In TABLE 1, the first embodiment, the variation, the second embodiment, the third embodiment ate indicated by A, B, C and D, respectively. As circuits to be compared with the embodiments, E and F are shown. E is an inverted amplifying circuit including switches of pMOS at the supply voltage side and the ground side. F is an inverted amplifying circuit with a switch of pMOS only at the supply voltage side.

TABLE 1

Structure of the Embodiments and Comparative Examples

| Circuit | Number of nMOS | Number of pMOS | Grounded Capacitance |
|---|---|---|---|
| A (First Embodiment) | 1 | 1 | 2C0 |
| B (Variation) | 1 | 1 | 3C0 |
| C (Second Embodiment) | 1 | 0 | 3C0 |
| D (Third Embodiment) | 0 | 1 | 3C0 |
| E (Comparative Example) | 1 at Ground | 1 at Supply Voltage | C0 |
| F (Comparative Example) | 0 | 1 at Supply Voltage | C0 |

Figure 8:
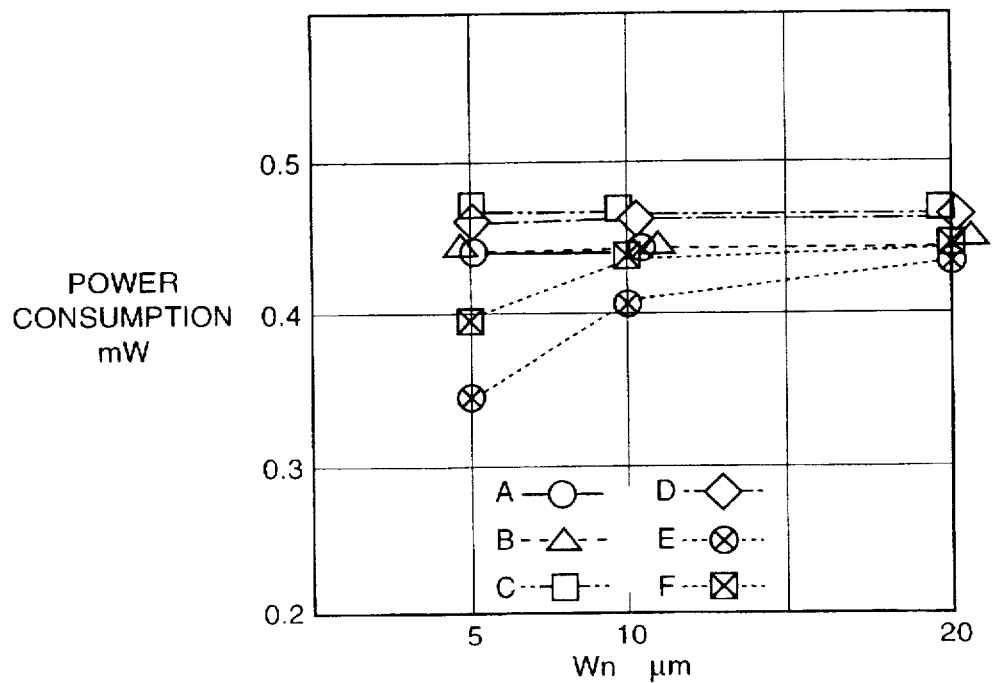
FIG. 8 is a graph showing the electric power consumption of the embodiments and the comparative examples.

TABLE 2 and FIG. 8 corresponding to TABLE 2 compare the electric power consumption between the embodiments and the comparative examples above. The embodiments and the comparative examples equivalently consume electric power though the embodiments consume a little more electric power than the comparative examples. The voltage input to them is sine wave of 1 MHz and of 0.5V to 2.5V. In FIG. 8, results of A, B, C and D arc shown by plots of circles and solid line, plots of triangles and broken line, plots of rectangles and chain double-dashed line, and plots of diamond and chain line, respectively. The comparative examples E and F are shown by plots of circle with cross and broken line, and plots of rectangle with cross and broken line, respectively.

Figure 9:
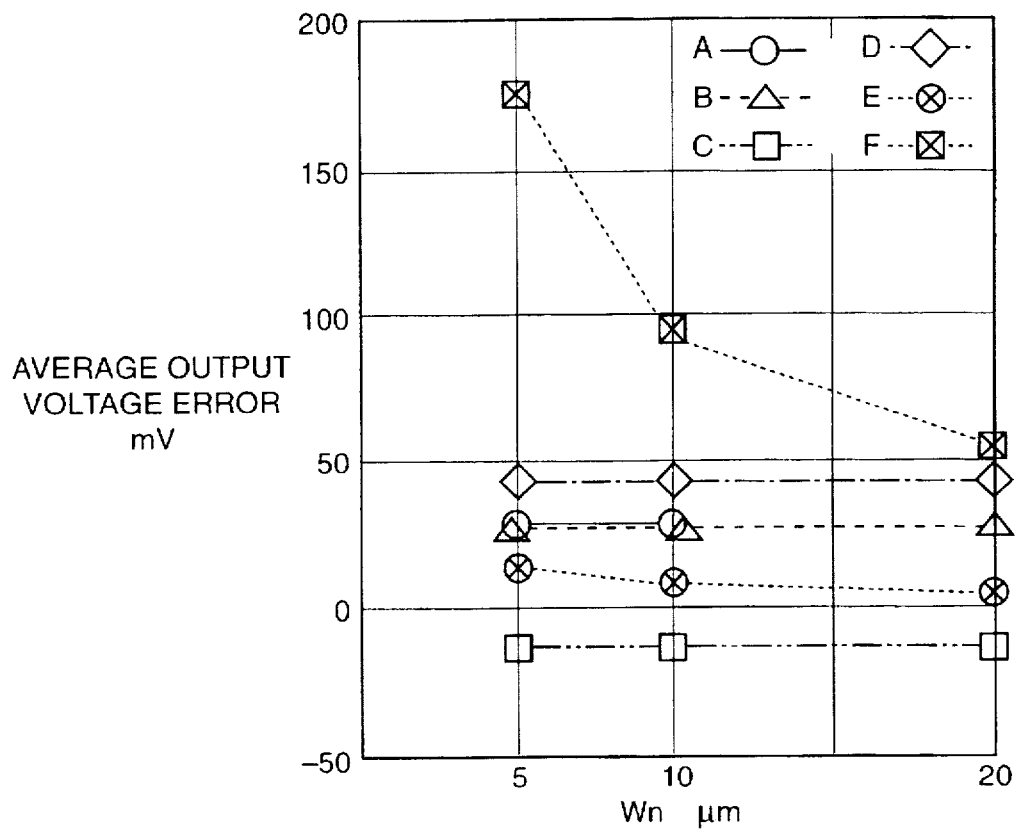
FIG. 9 is a graph showing the difference (average) of the embodiments and the comparative examples compared with an input voltage.

TABLE 3 and FIG. 9 corresponding to TABLE 3 show the average of errors of an output voltage of the embodiments and comparative examples, comparing with an input voltage. With respect to A to D, errors clearly decrease comparing with F. With respect to peak-to-peak of errors in TABLE 4 and FIG. 10, errors of A to D decrease more than those of E and F.

TABLE 2

Electric Power Consumption of Embodiments and Comparative Examples

| Wn μm | A | B | C | D | E | F (mW) |
|---|---|---|---|---|---|---|
| 5.0 | 0.44 | 0.44 | 0.46 | 0.45 | 0.34 | 0.40 |
| 10.0 | 0.44 | 0.44 | 0.47 | 0.45 | 0.40 | 0.43 |
| 20.0 | — | 0.44 | 0.47 | 0.45 | 0.44 | 0.46 |

TABLE 3

Difference of Embodiments and Comparative Examples

| Wn μm | A | B | C | D | E | F (mV) |
|---|---|---|---|---|---|---|
| 5.0 | 31.6 | 31.7 | −11.1 | 45.3 | 17.7 | 177.0 |
| 10.0 | 31.7 | 31.8 | −11.1 | 45.3 | 10.7 | 95.7 |
| 20.0 | — | 31.9 | −11.1 | 45.3 | 7.5 | 53.1 |

TABLE 4

Difference of Embodiments and Comparative Examples (p-p)

| Wn μm | A | B | C | D | E | F (mV) |
|---|---|---|---|---|---|---|
| 5.0 | 7.6 | 9.3 | 11.5 | 10.4 | 23.2 | 19.7 |
| 10.0 | 7.9 | 9.6 | 11.9 | 10.7 | 14.8 | 12.9 |
| 20.0 | — | 12.2 | 12.1 | 10.9 | 12.1 | 10.5 |

The effect can be confirmed that the accuracy of output can be improved by canceling the lowering voltage.

In the above embodiments, similar MOS switches arc provided in all CMOS inverters and balancing resistances. It is possible to aggregate MOS switches in the above embodiments.

As mentioned above, a MOS switch is connected in a CMOS inverter and a balancing resistance and the MOS switch is opened when the inverted amplifying circuit does not work. Therefore, it is possible to improve the accuracy of outputs of an inverted amplifying circuit of reducing electric power consumption.

What is claimed is:

1. An inverted amplifying circuit comprising:
   i) odd number of stages of CMOS inverters serially connected from the first to the last CMOS inverters;
   ii) an input capacitance connected to said first CMOS inverter for connecting an input voltage to an input of said first CMOS;
   iii) a feedback capacitance for connecting an output of said last CMOS to said input of said first CMOS;
   iv) a grounded capacitance for connecting said output of said last CMOS to the ground;
   v) a pair of balancing resistances for connecting an output of said CMOS between said first and last CMOS to a supply voltage and the ground; and
   vi) MOS switches connected between pMOS and nMOS of all said CMOS and connected between said balancing resistances.

2. An inverted amplifying circuit as claimed in claim 1, wherein each said MOS switch connected to said CMOS comprises a sub-pMOS and a sub-nMOS, said sub-pMOS being connected at its source to a drain of said pMOS, said sub-nMOS being connected at its source to a drain of said nMOS, drains of said sub-pMOS and sub-nMOS being defined as a common output for said CMOS, two control signals opposite to each other being connected to gates of said sub-pMOS and sub-nMOS, respectively.

3. An inverted amplifying circuit as claimed in claim 1, wherein each said MOS switch connected to said CMOS comprises a sub-nMOS a source of which is connected to a drain of said nMOS, a drain of said sub-nMOS and a drain of said pMOS being defined as a common output for said CMOS, a control signal being connected to a gate of said sub-nMOS.

4. An inverted amplifying circuit as claimed in claim 1, wherein each said MOS switch connected to said CMOS comprises a sub-pMOS a source of which is connected to a drain of said pMOS, a drain of said sub-pMOS and a drain of said nMOS being defined as a common output for said CMOS, a control signal being connected to a gate of said sub-pMOS.

* * * * *